(12) United States Patent
Hirasawa et al.

(10) Patent No.: US 6,274,404 B1
(45) Date of Patent: Aug. 14, 2001

(54) MULTILAYERED WIRING STRUCTURE AND METHOD OF MANUFACTURING THE SAME

(75) Inventors: Koki Hirasawa, Tokyo; Teruo Ono, Kagoshima, both of (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/401,789

(22) Filed: Sep. 22, 1999

(30) Foreign Application Priority Data

Sep. 25, 1998 (JP) .................................................. 10-271239

(51) Int. Cl.⁷ ............................. H01L 21/00; H01L 21/44
(52) U.S. Cl. .......................... 438/107; 438/14; 438/106; 438/126; 438/597; 438/660
(58) Field of Search ................................. 438/4, 15, 107, 438/109, 14, 106, 597, 660, 126, 622, 637, 642

(56) References Cited

U.S. PATENT DOCUMENTS

| 5,300,813 | * | 4/1994 | Joshi et al. ............................ 257/752 |
| 5,627,345 | * | 5/1997 | Yamamoto et al. ................. 174/265 |
| 5,798,568 | * | 8/1998 | Abercrombie et al. ............. 257/758 |

FOREIGN PATENT DOCUMENTS

| 63-274199 | 11/1988 | (JP) . |
| 1-287992 | 11/1989 | (JP) . |
| 6-318669 | 11/1994 | (JP) . |
| 12-31336 | 1/2000 | (JP) . |

OTHER PUBLICATIONS

English Language Patent Abstracts of Japanese published application 60–072253; Apr. 1985.*

Japanese Office Action dated Aug. 15, 2000, with partial translation.

* cited by examiner

Primary Examiner—Matthew Smith
Assistant Examiner—Igwe U. Anya
(74) Attorney, Agent, or Firm—McGinn & Gibb, PLLC

(57) ABSTRACT

A multilayered wiring structure includes a lower wiring layer, an interlevel insulating layer, a filling layer, an upper wiring layer, and a plated layer. The lower wiring layer is formed on a lead frame through an insulating layer. The interlevel insulating layer is formed on the lower wiring layer to have a via hole at a predetermined region thereof to expose an upper portion of the lower wiring layer. The filling layer is made of a conductive material to fill the via hole. The upper wiring layer is formed on the interlevel insulating layer to have an opening above a portion where the via hole is formed. The plated layer is formed on the upper wiring layer to be connected to the filling layer. A method of manufacturing a multilayered wiring structure is also disclosed.

22 Claims, 6 Drawing Sheets

MULTILAYERED WIRING STRUCTURE AND METHOD OF MANUFACTURING THE SAME

BACKGROUND OF THE INVENTION

The present invention relates to a multilayered wiring structure used in a hybrid integrated circuit or the like in which a plurality of integrated circuits are mounted, and a method of manufacturing the same.

In recent years, an increase in integration degree and operation speed of LSIs is remarkably high, and multi-pin chips that operate at a clock frequency of 100 MHz or more become commercially available. In a single chip-mounted package of such a high-speed chip, a delay in signal transmitted between the package and the printed circuit board is large, and the influence of parasitic capacitance or inductance of the package cannot be neglected in system design. Signal delay caused by the influence of the parasitic capacitance and inductance interferes with an increase in operation speed of the entire system.

In order to solve this signal delay, a technique is available with which chips are arranged as close as possible to each other to form a hybrid integrated circuit (multi-chip module: MCM). With the MCM, signal delay between chips caused by the package can be decreased, and the high operation speed of a single chip can be obtained even in a system composed of a plurality of chips.

FIG. 4 shows the arrangement of the MCM. The arrangement of the MCM will be described. A lower wiring layer 503 is formed on a die pad 501a on a lead frame 501 through an insulating layer 502, and an upper wiring layer 505 is formed on the lower wiring layer 503 through an interlevel insulating layer 504. An integrated circuit chip 506 and a resistor chip 507 are mounted at predetermined positions on the upper wiring layer 505. The integrated circuit chip 506 is connected to a predetermined portion of the upper wiring layer 505 with a wire 508. Predetermined portions of the upper wiring layer 505 and leads 501b are connected to each other with wires 508a. The resultant lead frame 501 is encapsulated with a molding resin 509 with the distal ends of the leads 501b being exposed.

The insulating layer 502 and interlevel insulating layer 504 described above are made of polyimide or the like, and the respective wiring layers are formed by patterning a conductor film formed on the insulating layer 502 and interlevel insulating layer 504 by vapor deposition or sputtering. The respective wiring layers are connected to each other through via holes 510.

The via holes 510 described above are roughly classified into two types, as shown in FIGS. 5A and 5B. The first type is called a stagger via hole type. According to this type, as shown in FIG. 5A, a via hole 603 to be connected to a lower wiring layer 601 is formed to continue to a wiring layer 604 through a hole (via hole) formed in an interlevel insulating layer 602 formed on the lower wiring layer 601. The stagger via hole is fabricated simultaneously with formation of the wiring material of the wiring layer 604.

The second type is called a filled via hole type, in which a filling layer is formed to fill a via hole. According to this type, as shown in FIG. 5B, a filling layer 603a is formed to fill a via hole formed in an interlevel insulating layer 602 formed on a lower wiring layer 601, and a wiring layer 604 is formed to be connected to the filling layer 603a. The filling layer 603a constituting this filled via hole is fabricated by, e.g., plating.

Since the stagger via hole is fabricated by a process such as vapor deposition or sputtering as described above, it is not suitable when forming via holes to overlap in the vertical direction. Due to this defect, the filled via hole formed by filling is superior.

Formation of a filled via hole will be briefly described. As shown in FIG. 6A, wiring layers 702 and 703 are formed on a substrate 701. As shown in FIG. 6B, an insulating layer 704 and a metal layer 705 respectively made of polyimide and a copper foil are formed to cover the wiring layers 702 and 703 on the substrate 701.

The resultant structure is processed by using a resist pattern as a mask, thus forming openings at predetermined regions of the metal layer 705. As shown in FIG. 6C, a metal pattern 705a is formed. The insulating layer 704 is etched by using the metal pattern 705a as a mask to form via holes 706 and 707. The resist pattern may be removed prior to formation of the via holes or during formation of the via holes simultaneously.

Copper is deposited on the wiring layers 702 and 703 exposed to the bottoms of the via holes 706 and 707 in accordance with electroplating using the wiring layers 702 and 703 as one electrode (cathode), to fill the via holes 706 and 707 with plated copper. When the surface of the copper portion growing by plating reaches the opening ends of the via holes 706 and 707, the upper end of the copper portion growing by plating comes in contact with the ends of the holes of the metal pattern 705a. When the copper portion growing by plating comes in contact with the metal pattern 705a, the metal pattern 705a becomes the common electrodeposition surface to grow copper. As shown in FIG. 6D, The via holes 706 and 707 are filled with filling layers 708 and 709, so that a copper plating film 710 is formed on the metal pattern 705a.

When filling the via holes 706 and 707 with copper by electroplating, if the upper end of the copper portion growing by plating comes into contact with the ends of the holes of the metal pattern 705a, abnormal plating growth occurs at these contact portions. Accordingly, the copper plating film 710 forms projecting portions 710a at the ends of the holes of the metal pattern 705a. This leads to a nonuniformity in the surface, which is a problem. Therefore, the projecting portions 710a are removed by polishing or the like to planarize the surface of the copper plating film 710, as shown in FIG. 6E.

The metal pattern 705a and copper plating film 710 are processed and upper wiring layers 711 and 712 are formed, as shown in FIG. 6F. As a result, the wiring layers 702 and 703 are connected to the upper wiring layers 711 and 712 through the filling layers 708 and 709, respectively. The upper wiring layers 711 and 712 are continuous to the filling layers 708 and 709 as they are formed simultaneously with the filling layers 708 and 709 by copper plating growth. The connection state between the filling layers 708 and 709 and the upper wiring layers 711 and 712 is much more reliable than that obtained when the filling layers 708 and 709 and the upper wiring layers 711 and 712 are formed separately.

Conventionally, however, as described above, abnormal plating growth causes a projecting portion 710 (dog bone phenomenon). Polishing must be performed to planarize the projecting portion.

Generally, polishing requires a very large amount of know-how, and polishing itself decreases the yield. The higher the degree of micropatterning, the cleaner the atmosphere where formation of a multilayered wiring structure is performed must be. However, polishing is a major factor that degrades cleanliness.

In fine, conventionally, since polishing is required to form filling layers, the yield of the multilayered wiring structure is degraded. If filling layers and wiring layers are simply formed separately without using polishing, unevenness or the like occurs due to the dog bone phenomenon, and the filling layers and the wiring layer cannot be connected to each other reliably.

SUMMARY OF THE INVENTION

It is, therefore, a principal object of the present invention to improve the reliability in connection between the filling layer and wiring layer of a multilayered wiring structure without using a process such as polishing that decreases the yield.

In order to achieve the above object, according to the present invention, there is provided a multilayered wiring structure comprising a first wiring layer formed on a substrate through a first insulating layer, a second insulating layer formed on the first wiring layer to have a hole at a predetermined region thereof to expose an upper portion of the first wiring layer, a filling layer made of a conductive material to fill the hole, a second wiring layer formed on the second insulating layer to have an opening above a portion where the hole is formed, and a metal film formed on the second wiring layer to be connected to the filling layer.

DESCRIPTION OF THE PREFERRED EMBODIMENTS

The preferred embodiments of the present invention will be described in detail with reference to the accompanying drawings.

First Embodiment

Figure 1A:
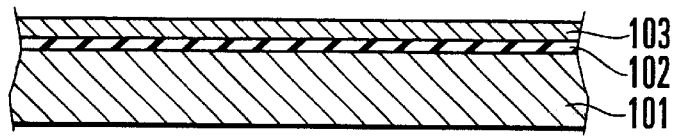
FIGS. 1A to 1K are views explaining a method of manufacturing a multilayered wiring structure according to the first embodiment of the present invention.
Figure 1A:
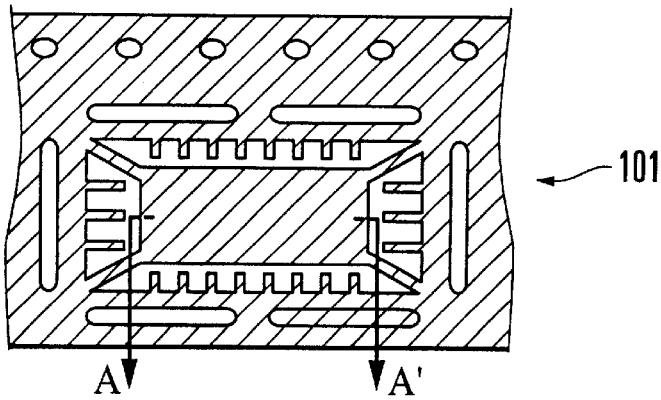

The first embodiment of the present invention will be described with reference to FIGS. 1A to 1K. A method of manufacturing a multilayered wiring structure according to the first embodiment will be described. As shown in FIG. 1A, an insulating layer (first insulating layer) 102 is formed on a lead frame (substrate) 101, and a wiring metal film 103 is formed on the insulating layer 102. The lead frame 101 is a metal plate made of copper formed as shown in the plan view of FIG. 1A'. FIG. 1A and FIGS. 1B to 1E show a section taken along the line A–A'of FIG. 1A'. To form the insulating layer 102, a layer made of polyamic acid is heated to convert it to a polyimide layer. The insulating layer 102 is a resin film having insulating properties and heat resistance. The wiring metal film 103 may be formed of copper or the like by electroless plating or sputtering.

Figure 1B:
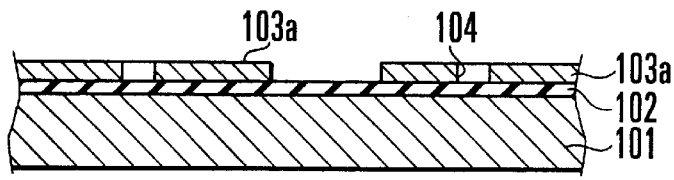

As shown in FIG. 1B, the wiring metal film 103 is patterned by, e.g., etching using as a mask a resist pattern formed by known lithography, to form a lower wiring layer (first wiring layer) 103a. Simultaneously, openings 104 are formed at portions of the lower wiring layer 103a that need be connected to the lead frame 101.

Figure 1C:
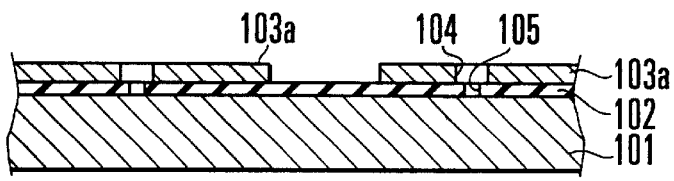

As shown in FIG. 1C, via holes (holes) 105 reaching the lead frame 101 are formed in regions of the insulating layer 102 that are exposed to the bottoms of the openings 104. The diameter of the via holes 105 is smaller than that of the openings 104 as much as possible.

Figure 1D:
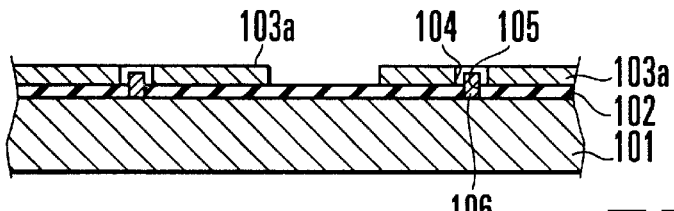

As shown in FIG. 1D, filling layers 106 are formed in connection to the bottoms of the via holes 105 where the lead frame 101 is exposed, to fill the via holes 105. For example, the filling layers 106 may be formed by plating the inner surfaces of the via holes 105 with copper by electroplating using the lead frame 101 as one electrode. The filling layers 106 are formed to project from the surface of the insulating layer 102. Preferably, the upper portions of the filling layers 106 do not project from the surface of the lower wiring layer 103a.

The hole diameter of the via holes 105 need not always be smaller than that of the openings 104. If, however, the hole diameter of the via holes 105 is equal to that of the openings 104, during formation of the filling layers 106 by electroplating using the lead frame 101 as one electrode, when the filling layers 106 come into contact with the lower wiring layer 103a at the ends of the openings 104 in plating growth, abnormal plating growth occurs.

If the hole diameter of the via holes 105 is smaller than that of the openings 104 as described above, contact between the filling layers 106 and the ends of the openings 104 during plating growth can be prevented.

Figure 1E:
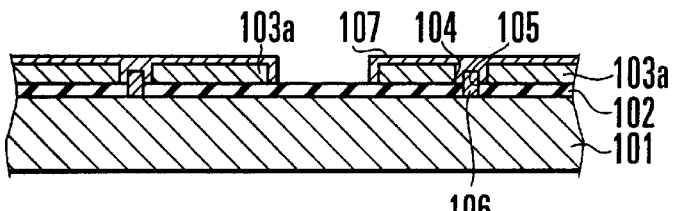

As shown in FIG. 1E, a plating film (metal film) 107 is self-aligned on the lower wiring layer 103a. The plating film 107 is formed by forming a copper film by electroplating. Plating may be performed by connecting a plating electrode to the lower wiring layer 103a. When the plating film 107 is formed, the openings 104 in the lower wiring layer 103a are filled with the plating film 107. As a result, the lower wiring layer 103a and filling layers 106 are connected to each other through the plating film 107 filled in the openings 104.

Figure 1F:
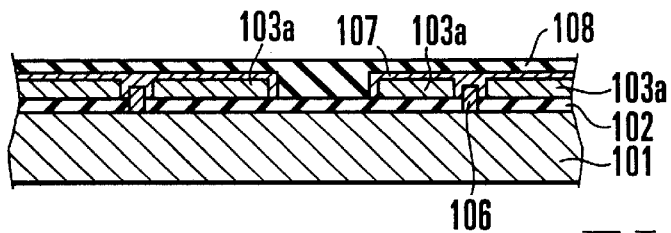

As shown in FIG. 1F, an interlevel insulating layer 108 is formed on the insulating layer 102 including the plating film 107.

Figure 1G:
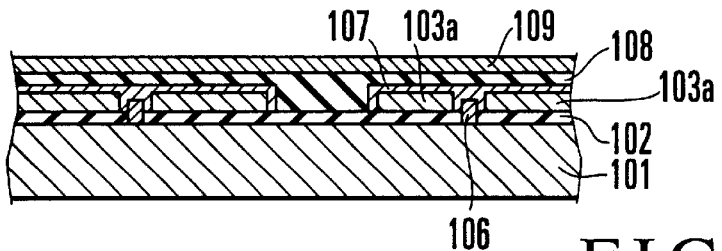

As shown in FIG. 1G, a wiring metal film 109 made of copper is formed on the interlevel insulating layer (second insulating layer) 108. For example, the wiring metal film 109 may be formed by electroplating or sputtering.

Figure 1H:
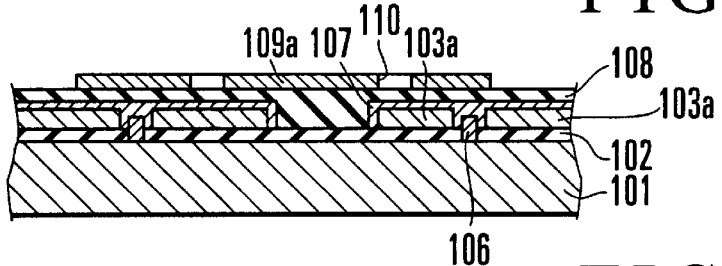

As shown in FIG. 1H, the wiring metal film 109 is patterned by using as a mask a resist pattern formed by (e.g., etching) known lithography, to form an upper wiring layer (second wiring( layer) 109a. Simultaneously, openings 110 are formed at portions of the upper wiring layer 109a that need to be connected to the lower wiring layer 103a.

Figure 1I:
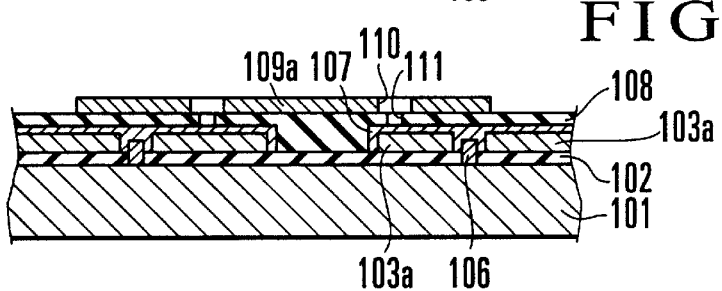

As shown in FIG. 1I, via holes 111 reaching the lower wiring layer 103a are formed by, e.g., a laser, in regions of the interlevel insulating layer 108 that are exposed to the bottoms of the openings 110. The diameter of the via holes 111 is smaller than that of the openings 110 as much as possible, as described above.

Figure 1J:
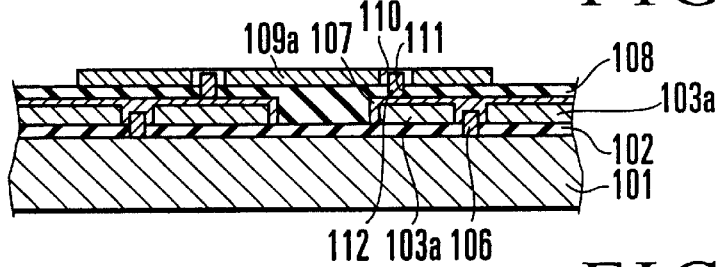

As shown in FIG. 1J, filling layers 112 are formed in connection to the bottoms of the via holes 111 where the lower wiring layer 103a is exposed, to fill the via holes 111. The filling layers 112 are formed to project from the surface of the interlevel insulating layer 108.

Figure 1K:
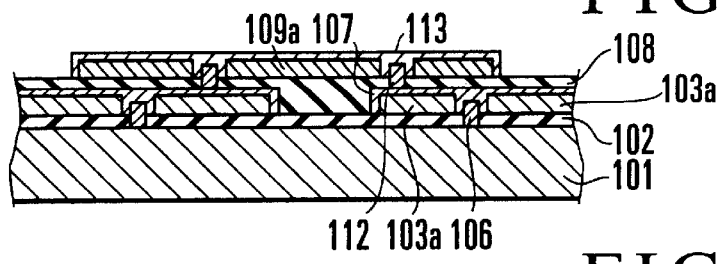

As shown in FIG. 1K, a plating film 113 is self-aligned on the upper wiring layer 109a. The plating film 113 is formed by forming a copper film by electroplating. Plating may be performed by connecting a plating electrode to the upper wiring layer 109a. When the plating film 113 is formed, the openings 110 in the upper wiring layer 109a are filled with the plating film 113. As a result, the upper wiring layer 109a and filling layers 112 are connected to each other through the plating film 113 filled in the openings 110.

As described above, according to the first embodiment, the filling layers are formed only by deposition in accordance with plating or the like. In this formation, the upper portions of the filling layers project from the via holes to a certain degree.

The wiring layer and filling layers are not connected to each other directly, but are connected through the plating film formed to cover the wiring layer.

In this manner, the upper ends of the filling layers are covered with portions of the plating film that fill the openings of the wiring layer, so that they are connected to the plating film. The plating film and the upper ends of the filling layers are connected to each other stably and highly reliably.

Since the plating film is formed to cover the wiring layer, the plating film and the wiring layer are connected to each other stably and highly reliably.

Accordingly, the wiring layer and the filling layers are connected to each other through the plating film stably and highly reliably.

In the manufacture of the wiring layer, the filling layers, and the plating film, it suffices if the filling layers are formed such that their distal ends project from the via holes to a certain degree, so precise plating amount control is not needed. No additional process is required at all. To connect the filling layers to the wiring layer, the plating film is self-aligned, and no complicated process is required. In other words, with the method of manufacturing a multilayered wiring structure according to the first embodiment, the filling layers and the wiring layer can be connected to each other highly reliably by film deposition in accordance with conventional simple plating.

Second Embodiment

The second embodiment of the present invention will be described with reference to FIGS. 2A to 2J.

Figure 2A:
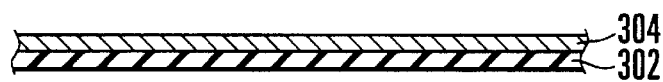
FIGS. 2A to 2J are views explaining a method of manufacturing a multilayered wiring structure according to the second embodiment of the present invention.

As shown in FIG. 2A, a sheet composed of an insulating film 302 on which a conductor film 304 made of copper is formed is prepared. As the insulating film 302, for example, a thermoplastic polyimide film may be used. The conductor film 304 is formed by forming a copper film on the surface of the insulating film 302. To form the polyimide film, a film made of polyamic acid is heated. The insulating layer 302 is a resin film having insulating properties and heat resistance.

Figure 2B:
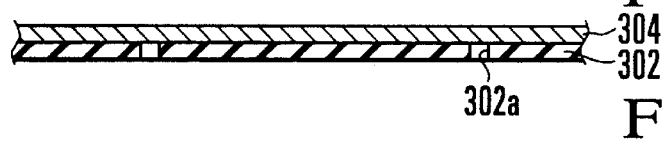
Figure 2C:
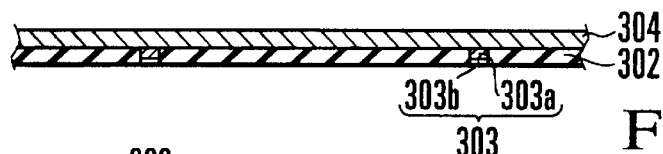

As shown in FIG. 2B, via holes 302a are formed at predetermined portions of the insulating film 302 by using, e.g., a laser. As shown in FIG. 2C, filling layers 303 are formed in the via holes 302a. More specifically, copper portions 303a are formed in the via holes 302a by electroplating using the conductor film 304 as one electrode. Gold portions 303b are formed to cover the surfaces of the copper portions 303a by electroplating using the conductor film 304 as one electrode, thereby forming the filling layers 303 each comprised of the copper portion 303a and gold portion 303b.

Figure 2D:
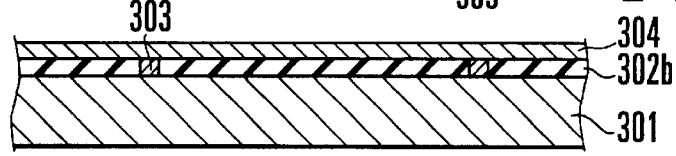

As shown in FIG. 2D, the insulating film 302 formed with the conductor film 304 is adhered to a lead frame 301, so that the conductor film 304 is formed on the lead frame 301 through an insulating layer 302b comprised of the insulating film 302. The lead frame 301 is made of a metal, i.e., copper.

The resultant structure is heated while applying a pressure from above to portions corresponding to the filling layers 303, thereby thermally bonding the filling layers 303 and lead frame 301 to each other. As described above, the surfaces of the filling layers 303 are plated with gold. By thermal bonding, copper in the lead frame 301 is diffused to gold, thereby forming an alloy at the interfaces between the lead frame 301 and the gold plating portions of the filling layers 303. As a result, the filling layers 303 and lead frame 301 are connected to each other more firmly to greatly increase the reliability in connection state between the filling layers 303 and lead frame 301.

Figure 2E:
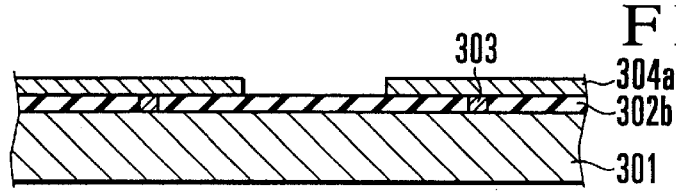

The conductor film 304 is processed by, e.g., etching using as a mask a resist pattern formed by known lithography, so that a wiring layer 304a is formed on the insulating layer 302b, as shown in FIG. 2E.

Figure 2F:

As shown in FIG. 2F, a sheet composed of an insulating film 305 on which a conductor film 307 made of copper is formed is prepared, in the same manner as described above.

Figure 2G:
Figure 2H:

As shown in FIG. 2G, via holes 305a are formed at predetermined portions of the insulating film 305. As shown in FIG. 2H, filling layers 306 are formed in the via holes 305a. More specifically, copper portions 306a are formed in the via holes 305a by electroplating using the conductor film 307 as one electrode. Gold portions 306b are formed to cover the surfaces of the copper portions 306a in the via holes 305a by electroplating using the conductor film 307 as one electrode, thereby forming the filling layers 306 each comprised of the copper portion 306a and gold portion 306b.

Figure 2I:
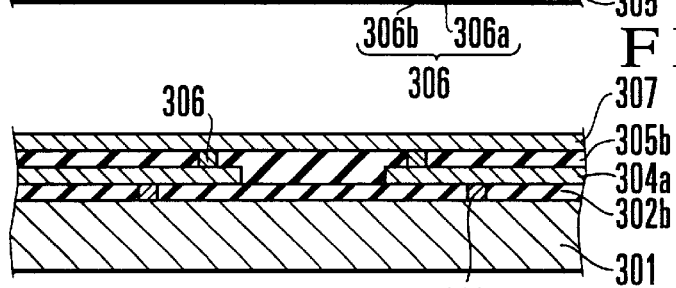

As shown in FIG. 2I, the insulating film 305 formed with the conductor film 307 is adhered to the insulating layer 302b including the wiring layer 304a, so that the conductor film 307 is formed on the wiring layer 304a through an insulating layer 305b comprised of the insulating film 305.

Figure 2J:
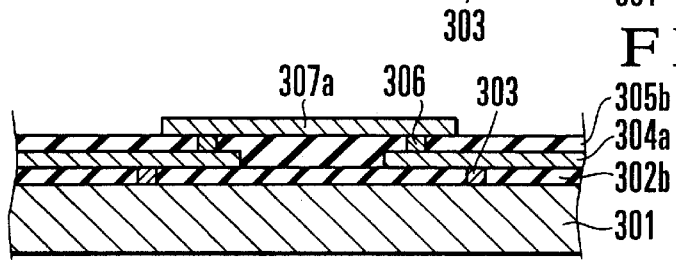

The conductor film 307 is processed by, e.g., etching using as a mask a resist pattern formed by known lithography, so that a wiring layer 307a is formed on the insulating layer 305b, as shown in FIG. 2J.

The resultant structure is heated by applying a pressure from above to portions corresponding to the filling layers 306, thereby thermally bonding the filling layers 306 and wiring layer 304a to each other. As described above, the surfaces of the filling layers 306 are plated with gold. By thermal bonding, copper in the filling layers 306 is diffused to gold, thereby forming an alloy at the interfaces between the wiring layer 304a and the gold plating portions of the filling layers 306. As a result, the filling layers 306 and wiring layer 304a are connected to each other more firmly to greatly increase the reliability in connection state between the filling layers 306 and wiring layer 304a.

The conductor film 307 is processed by, e.g., etching using as a mask a resist pattern formed by known lithography, so that the wiring layer 307a is formed on the insulating layer 305b, as shown in FIG. 2J. As a result, a multilayered wiring structure is formed on the metal lead frame 301.

In this case, even if the formation heights of the filling layers vary, i.e., for example, even if a filling layer at one portion projects more than other filling portions do, it is easily planarized by thermal bonding since the upper portions of the filling layers are made of a metal having high malleability.

Third Embodiment

The third embodiment of the present invention will be described with reference to FIGS. 3A to 3G.

Figure 3A:
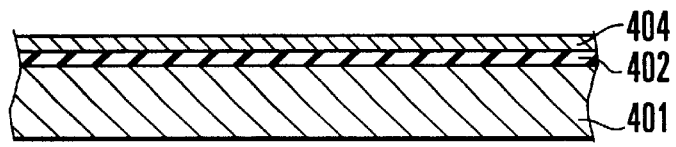
FIGS. 3A to 3G are views explaining a method of manufacturing a multilayered wiring structure according to the third embodiment of the present invention.

As shown in FIG. 3A, an insulating layer 402 having an upper surface formed with a conductor film 404 is formed on a lead frame 401. The lead frame 401 is made of a metal, i.e., copper. The insulating layer 402 is a resin film, e.g., a polyimide film, having insulating properties and heat resistance.

Figure 3B:
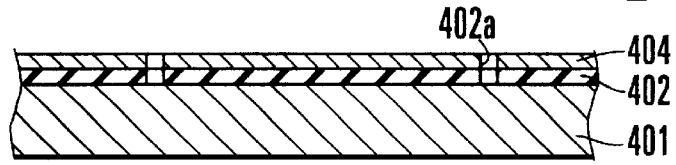

As shown in FIG. 3B, via holes 402a extending through the conductor film 404 and insulating layer 402 are formed to expose the surface of the lead frame 401. The holes in the conductor film 404 are slightly larger than holes formed in the insulating layer 402.

Figure 3C:
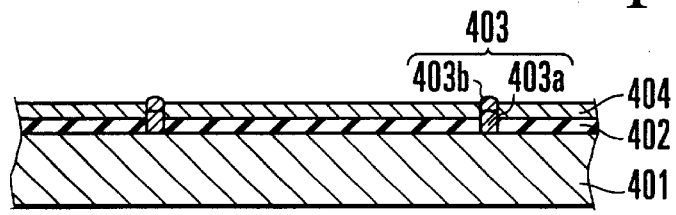

As shown in FIG. 3C, filling layers 403 are formed in the via holes 402a. Each filling layer 403 has a two-layered structure of copper and gold. More specifically, copper portions 403a are formed in the via holes 402a by electroplating using the conductor film 404 as one electrode. Gold portions 403b are formed by electroplating using the conductor film 404 as one electrode, to cover the surfaces of the copper portions 403a. Therefore, each filling layer 403 is comprised of the copper portion 403a and gold portion 403b. The upper portions of the filling layers 403 project from the surface of the conductor film 404.

Figure 3D:
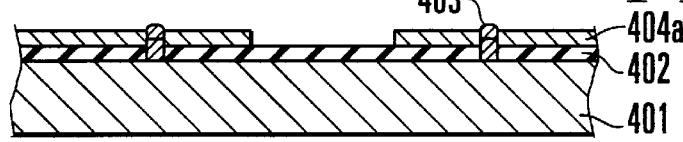

The conductor film 404 is processed by, e.g., etching using as a mask a resist pattern formed by known lithography, so that a wiring layer 404a is formed on the insulating layer 402, as shown in FIG. 3D.

Figure 3E:
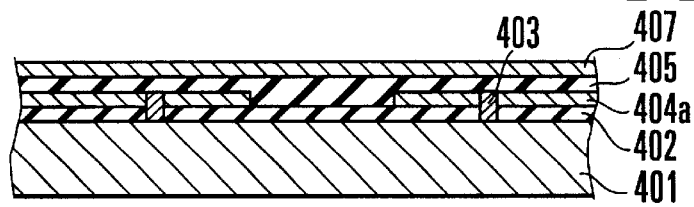

As shown in FIG. 3E, an insulating layer 405 having an upper surface formed with a conductor film 407 is formed. The resultant structure is heated while applying a pressure to portions corresponding to the filling layers 403, so that the upper portions of the filling layers 403 are flattened to be thermally bonded with the wiring layer 404a.

The surfaces of the filling layers 403 are plated with gold, as described above. By thermal bonding described above, gold portions formed on the copper portions 403a by plating are flattened to be bonded with the side surfaces of the forming portions and the upper surfaces of the ends of the via holes 402a of the wiring layer 404a. Simultaneously, copper that forms the wiring layer 404a is diffused to gold, thereby forming an alloy at the interfaces between the wiring layer 404a and the gold plating portions of the filling layers 403. As a result, the filling layers 403 and wiring layer 404a are connected to each other more firmly to greatly increase the reliability in connection state between the filling layers 403 and wiring layer 404a. Since the filling layers 403 are connected to the wiring layer 404a by flattening their upper portions, a flat state can be obtained easily without requiring precise plating amount control.

Figure 3F:
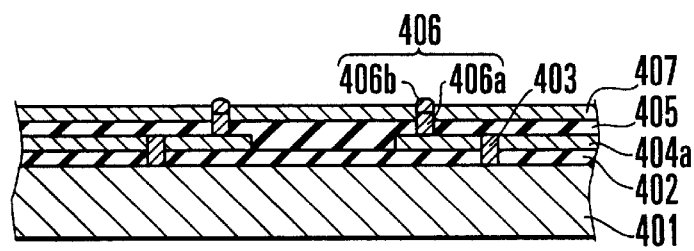

Via holes 405a extending through the conductor film 407 and insulating layer 405 are formed to expose the surface of the wiring layer 404a. The holes in the conductor film 407 are slightly larger than holes formed in the insulating layer 405. As shown in FIG. 3F, filling layers 406 having the same arrangement as that of the filling layers 403 are formed in the via holes 405a.

Figure 3G:
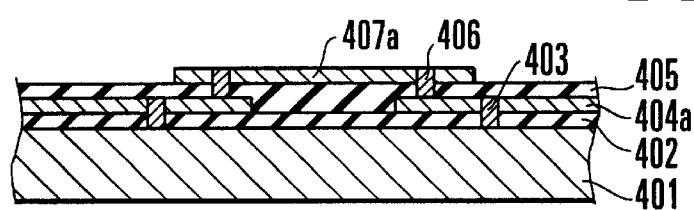
Figure 4:
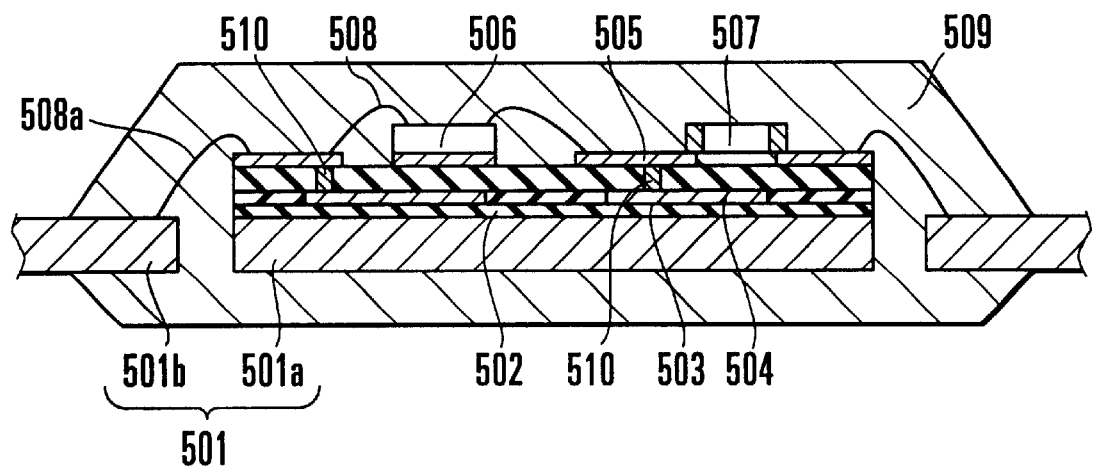
FIG. 4 is a view showing the arrangement of a conventional hybrid integrated circuit (multi-chip module: MCM)
Figure 5A:
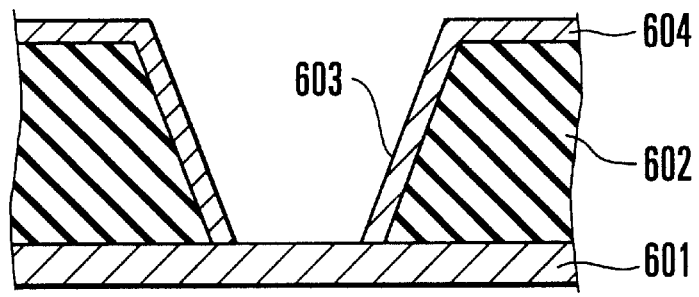
FIGS. 5A and 5B are sectional views, respectively, schematically showing the arrangements of via holes used in the multilayered wiring structure of an MCM.
Figure 5B:
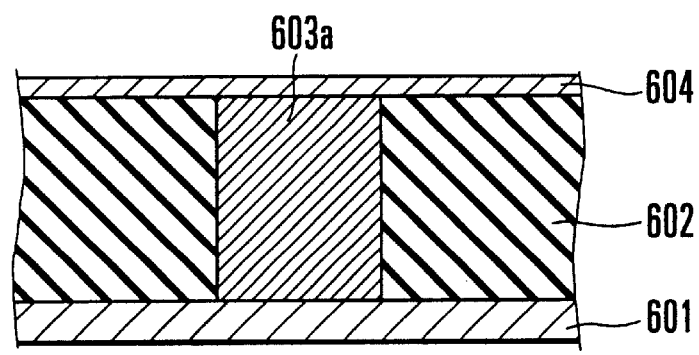
Figure 6A:
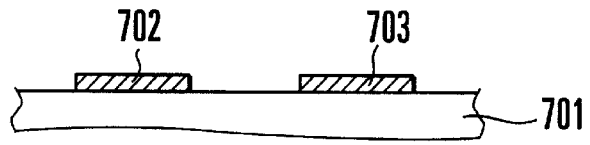
FIGS. 6A to 6F are views for briefly explaining formation of filled via holes.
Figure 6B:
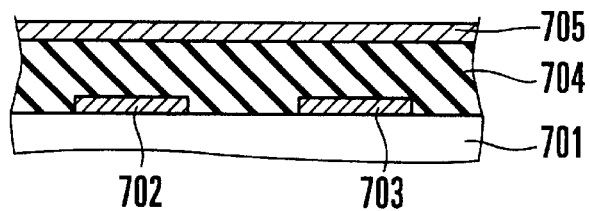
Figure 6C:
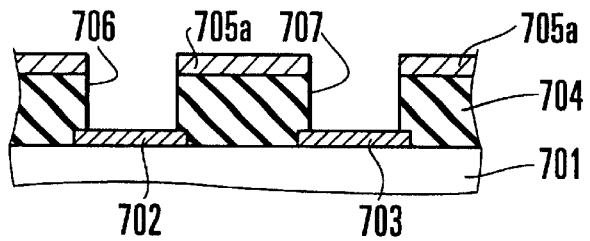
Figure 6D:
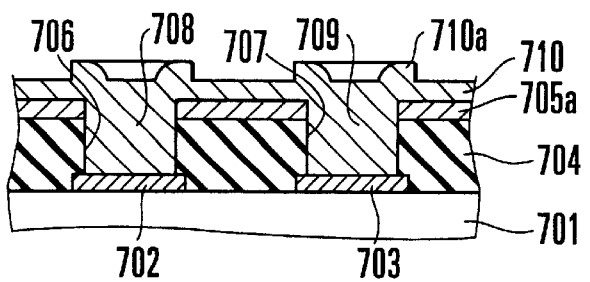
Figure 6E:
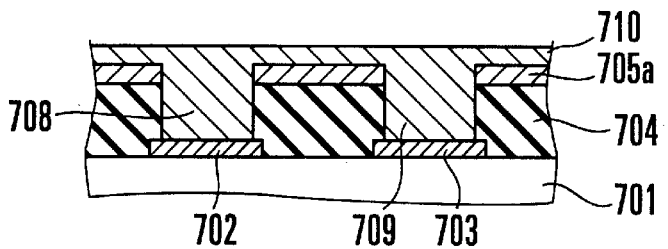
Figure 6F:
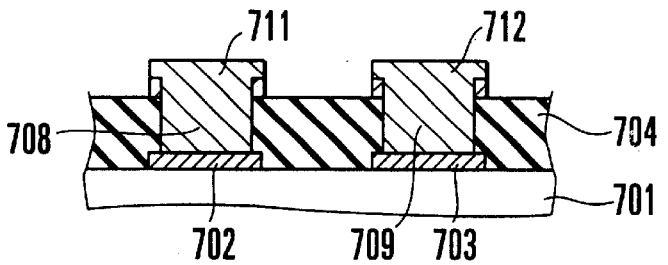

The conductor film 407 is processed by, e.g., etching using as a mask a resist pattern formed by known lithography, so that a wiring layer 407a is formed on the insulating layer 405, as shown in FIG. 3G.

After that, the resultant structure is heated while applying a pressure from above to portions corresponding to the filling layers 406, so that the upper portions of the filling layers 406 are flattened to be thermally bonded to the wiring layer 407a. Alternatively, as described in the first embodiment, the wiring layer 407a may be connected to one electroplating electrode and electroplating may be performed, thereby connecting the filling layers 406 and wiring layer 407a to each other.

As a result, a multilayered wiring structure is formed on the metal lead frame 401.

In the third embodiment as well, even if the formation heights of the filling layers vary, i.e., for example, even if a filling layer at one portion projects more than other filling portions do, it is easily planarized by thermal bonding since the upper portions of the filling layers are made of a metal having high malleability.

Since the wiring layer and filling layers are connected to each other by forming the alloy of gold and copper at their interfaces, the wiring layer and the upper ends of the filling layers are connected to each other stably and highly reliably.

As has been described above, according to the present invention, there is provided a multilayered wiring structure comprising a first wiring layer formed on a substrate through a first insulating layer, a second insulating layer formed on the first wiring layer to have a hole at a predetermined region thereof to expose an upper portion of the first wiring layer, a filling layer made of a conductive material to fill the hole, a second wiring layer formed on the second insulating layer to have an opening above a portion where the hole is formed, and a metal film formed on the second wiring layer by filling the opening so as to be connected to the filling layer.

In this arrangement, the second wiring layer and the filling layer are not in direct contact with each other, but are connected to each other through the metal film.

According to the present invention, there is also provided a multilayered wiring structure comprising a metal substrate, a first insulating layer formed on the substrate to have a first hole at a predetermined region thereof to expose an upper portion of the substrate, a first filling layer made of a conductive material to fill the first hole, a first wiring layer formed on the first insulating layer to have a first opening above a portion where the hole is formed, and a first metal film formed on the first wiring layer by filling the first opening so as to be connected to the first filling layer.

In this arrangement, the filling layer connected to the substrate, and the first wiring layer are not in direct contact with each other, but are connected to each other through the metal film.

Therefore, according to the present invention, even if the projecting amount of the filling layer above the second insulating layer varies, since the metal film fills the opening, the projection of the filling layer is buried with the metal film that fills the opening. As a result, according to the present invention, the surface of the metal film of the second wiring layer is formed flat. Since the second wiring layer and the filling layer are connected to each other through the metal film, they are connected at high reliability.

According to the present invention, there is also provided a multilayered wiring structure comprising a first wiring layer formed on a substrate through a first insulating layer, a second insulating layer formed on the first wiring layer to have a hole at a predetermined region thereof to expose an upper portion of the first wiring layer, a filling layer made of a first metal and a second metal covering the first metal to fill the hole, and a second wiring layer formed on the second insulating layer to cover the filling layer, wherein an alloy of the second metal and a metal forming the first wiring layer is formed at a contact region between a lower portion of the filling layer and the first wiring layer.

In this arrangement, the first wiring layer and the filling layer are connected to each other through the formed alloy, and substantially no interface exists between them.

According to the present invention, there is also provided a multilayered wiring structure comprising an insulating layer formed on a metal substrate to have a hole exposing a surface of the substrate, a filling layer made of first and second metals to fill the hole, and a wiring layer formed on the insulating layer to cover the filling layer, wherein an alloy of the second metal and a metal forming the substrate is formed at a contact region between a lower portion of the filling layer and the substrate.

In this arrangement, the substrate and the filling layer are connected to each other through the formed alloy, and substantially no interface exists between them.

Therefore, according to the present invention, the first wiring layer and the filling layer are connected to each other at high reliability. Similarly, the substrate and the filling layer are connected to each other at high reliability. Since the first wiring layer and the filling layer, and the substrate and the filling layer are compression-bonded, the surface of the second wiring layer or of the wiring layer is flat even at a filling layer forming portion.

According to the present invention, there is also provided a multilayered wiring structure comprising a first wiring layer formed on a substrate through a first insulating layer, a second insulating layer formed on the first wiring layer to have a first hole at a predetermined region thereof to expose an upper portion of the first wiring layer, a second wiring layer formed on the second insulating layer and having a second opening formed to continue to an upper portion of the first hole, and a filling layer made of first and second metals to fill the first and second holes, wherein an alloy of the second metal and a metal forming the first wiring layer is formed at a contact region between an upper portion of the filling layer and the second wiring layer.

In this arrangement, the second wiring layer and the filling layer are connected to each other through the formed alloy, and substantially no interface exists between them.

Therefore, according to the present invention, the second wiring layer and the filling layer are connected to each other at high reliability. Since the second wiring layer and the filling layer are compression-bonded, the surface of the second wiring layer is flat even at a filling layer forming portion.

According to the present invention, there is also provided a multilayered wiring structure comprising an insulating layer formed on a metal substrate and having a first hole exposing a surface of the substrate, a wiring layer formed on the insulating layer and having a second opening formed to continue to an upper portion of the first hole, and a filling layer made of first and second metals to fill the first and second holes, wherein an alloy of the second metal and a metal forming the wiring layer is formed at a contact region between an upper portion of the filling layer and the wiring layer.

In this arrangement, the wiring layer and the filling layer are connected to each other through the formed alloy, and substantially no interface exists between them.

Therefore, according to the present invention, the wiring layer and the filling layer are connected to each other at high reliability. Since the wiring layer and the filling layer are compression-bonded, the surface of the wiring layer is flat even at a filling layer forming portion.

According to the present invention, there is also provided a method of manufacturing a multilayered wiring structure, comprising the first step of forming a first wiring layer on a substrate through a first insulating layer, the second step of forming a second wiring layer on the first wiring layer through a second insulating layer, the third step of forming an opening in the second wiring layer to expose the second insulating layer, the fourth step of forming a hole in the second insulating layer exposed to the opening, to expose an upper portion of the first wiring layer, the fifth step of forming a filling layer made of a conductive material to fill the hole, and the sixth step of forming a metal layer on the second wiring layer by, e.g., electroplating, to come into contact with the filling layer.

Therefore, the multilayered wiring structure is manufactured such that the second wiring layer and the filling layer are connected to each other through the metal film.

According to the present invention, there is also provided a method of manufacturing a multilayered wiring structure, comprising the first step of forming a first wiring layer on a metal substrate through a first insulating layer, the second step of forming an opening in the first wiring layer to expose the first insulating layer, the third step of forming a hole in the first insulating layer exposed to the opening, to expose an upper portion of the substrate, the fourth step of forming a filling layer made of a conductive material to fill the hole, and the fifth step of forming a metal layer on the first wiring layer by, e.g., electroplating, to come into contact with the filling layer.

In this arrangement, the multilayered wiring structure is manufactured such that the substrate and the filling layer are connected to each other through the metal film.

Therefore, according to the present invention, even if the projecting amount of the filling layer above the second insulating layer varies, since the metal film fills the opening, the projection of the filling layer is buried with the metal film that fills the opening. As a result, according to the present invention, the surface of the metal film of the second wiring layer is formed flat. Since the second wiring layer and the filling layer are connected to each other through the metal film, they are connected at high reliability.

According to the present invention, there is also provided a method of manufacturing a multilayered wiring structure, comprising the first step of forming a first wiring layer on a substrate through a first insulating layer, the second step of preparing an insulating film formed with a conductor film, the third step of forming a hole in the insulating film to expose the conductor film, the fourth step of forming a filling layer made of a first metal and a second metal covering the first metal to fill the hole, the fifth step of fixing the insulating film on the first wiring layer with the metal film being located at an upper portion, such that the filling layer comes into contact with a predetermined portion of the first wiring layer, to form a second wiring layer composed of the conductor film on the first wiring layer through a second insulating layer composed of the insulating film, and the sixth step of compression-bonding the filling layer and the first wiring layer by heating a contact portion therebetween to a predetermined temperature such that the first and second metals are diffused to each other, thereby forming an alloy of the second metal and a metal forming the first wiring layer at a contact region between the filling layer and the first wiring layer.

Therefore, the multilayered wiring structure is formed such that the first wiring layer and the filling layer are connected to each other through the formed alloy, and substantially no interface exists between the first wiring layer and the filling layer.

Therefore, according to the present invention, the first wiring layer and the filling layer are connected to each other at high reliability. Since the first wiring layer and the filling layer are compression-bonded, the surface of the second wiring layer is flat.

According to the present invention, there is also provided a method of manufacturing a multilayered wiring structure, comprising the first step of preparing an insulating film formed with a conductor film, the second step of forming a hole in the insulating film to expose the conductor film, the third step of forming a filling layer made of a first metal and a second metal covering the first metal to fill the hole, the fourth step of fixing the insulating film on the substrate with the metal film being located at an upper portion, such that the filling layer comes into contact with a predetermined portion of the metal substrate, to form a wiring layer composed of the conductor film on the substrate through a first insulating layer composed of the insulating film, and the fifth step of bonding the filling layer and the substrate by heating a contact portion therebetween to a predetermined temperature, thereby forming an alloy of the second metal and a metal forming the substrate at a contact region between the filling layer and the substrate.

Therefore, the multilayered wiring structure is formed such that the substrate and the filling layer are connected to each other through the formed alloy, and substantially no interface exists between the first wiring layer and the filling layer.

Therefore, according to the present invention, the substrate and the filling layer are connected to each other at high reliability. Since the substrate and the filling layer are compression-bonded, the surface of the wiring layer is flat.

According to the present invention, there is also provided a method of manufacturing a multilayered wiring structure, comprising the first step of forming a first wiring layer on a substrate through a first insulating layer, the second step of forming a conductor film made of a metal on the first wiring layer through an insulating layer, the third step of forming a hole extending from the conductor film to the insulating film to expose a surface of the first wiring layer, the fourth step of forming a filling layer made of a first metal and a second metal covering the first metal to fill the hole from an exposed surface of the first wiring layer, the fifth step of processing the conductor film to form a second wiring layer, and the sixth step of compression-bonding the filling layer and the wiring layer by heating a contact portion therebetween to a predetermined temperature, to form an alloy of the second metal and a metal forming the second wiring layer at a contact region between the filling layer and the second wiring layer.

Therefore, the multilayered wiring structure is formed such that the second wiring layer and the filling layer are connected to each other through the formed alloy, and substantially no interface exists between the first wiring layer and the filling layer. Therefore, according to the present invention, the second wiring layer and the filling layer are connected to each other at high reliability. Since the second wiring layer and the filling layer are compression-bonded, the surface of the second wiring layer is flat.

According to the present invention, there is also provided a method of manufacturing a multilayered wiring structure, comprising the first step of forming a conductor film on a metal substrate through an insulating layer, the second step of forming a hole extending from the conductor film to the insulating film to expose a surface of the substrate, the third step of forming a filling layer made of a first metal and a second metal covering the first metal to fill the hole from an exposed surface of the substrate, the fourth step of processing the conductor film to form a wiring layer, and the fifth step of compression-bonding the filling layer and the wiring layer by heating a contact portion therebetween to a predetermined temperature, to form an alloy of the second metal and a metal forming the wiring layer at a contact region between the filling layer and the wiring layer.

Therefore, the multilayered wiring structure is formed such that the wiring layer and the filling layer are connected to each other through the formed alloy, and substantially no interface exists between the wiring layer and the filling layer. Therefore, according to the present invention, the wiring layer and the filling layer are connected to each other at high reliability. Since the wiring layer and the filling layer are compression-bonded, the surface of the wiring layer is flat.

What is claimed is:

1. A method of manufacturing a multilayered wiring structure, comprising:
    forming a first insulating layer on a substrate;
    forming a first wiring layer on said first insulating layer;
    forming a second insulating layer on said first wiring layer;
    forming a second wiring layer on said second insulating layer;
    forming an opening in said second wiring layer to expose said second insulating layer;
    forming a hole in said second insulating layer exposed by said opening to expose an upper portion of said first wiring layer;
    forming a filling layer made of a conductive material to fill said hole; and
    forming a metal layer on said second wiring layer to come into contact with said filling layer.

2. A method according to claim 1, wherein said metal layer is formed by electroplating using said second wiring layer as one electrode.

3. A method according to claim 1, further comprising:
    forming a conductor film on an insulating film; and
    fixing said insulating film to said substrate or said first wiring layer with said conductor film being located over said insulating film, so that said first wiring layer comprised of said conductor film is formed on said first insulating layer comprised of said insulating film, or said second wiring layer comprised of said conductor film is formed on said second insulating layer comprised of said insulating film.

4. A method according to claim 1, wherein said hole has a diameter smaller than that of said opening.

5. A method according to claim 1, wherein said filling layer is formed to project from a surface of an insulating layer formed with said hole where said filling layer is formed.

6. A method of manufacturing a multilayered wiring structure, comprising:
    forming an insulating layer on a metal substrate;
    forming a wiring layer on said insulating layer;
    forming an opening in said wiring layer to expose said insulating layer;
    forming a hole in said insulating layer exposed by said opening, to expose an upper portion of said metal substrate;
    forming a filling layer made of a conductive material to fill said hole; and
    forming a metal layer on said wiring layer to contact said filling layer.

7. A method according to claim 6, wherein said metal layer is formed by electroplating using said wiring layer as one electrode.

8. A method according to claim 6, further comprising:

forming a conductor film on an insulating film; and fixing said insulating film to said substrate with said conductor film being over the insulating film, so that said wiring layer comprised of said conductor film is formed on said insulating layer comprised of said insulating film.

9. A method according to claim 6, wherein said hole has a diameter smaller than that of said opening.

10. A method according to claim 6, wherein said filling layer is formed to project from a surface of an insulating layer formed with said hole where said filling layer is formed.

11. A method of manufacturing a multilayered wiring structure, comprising:

forming a first insulating layer on a substrate;

forming a first wiring layer on said first insulating layer;

forming a conductor film made of a metal on an insulating film;

forming a hole in said insulating film to expose said conductor film;

forming a filling layer made of a first metal and a second metal covering said first metal to fill said hole;

adhering said insulating film with said conductor film formed thereon to said first wiring layer, said conductor film being located over the insulating film, such that said filling layer comes into contact with a predetermined portion of said first wiring layer, said conductor film forming a second wiring layer on a second insulating layer comprising said insulating film; and compression-bonding said filling layer and said first wiring layer by heating a contact portion therebetween to a predetermined temperature, to form an alloy of said second metal and a metal forming said first wiring layer at a contact region between said filling layer and said first wiring layer.

12. A method according to claim 11, wherein the adhering and compression-bonding are performed simultaneously.

13. A method according to claim 11, wherein said first wiring layer is made of copper, and said second metal is gold.

14. A method according to claim 11, wherein said filling layer is formed to project from a surface of an insulating layer formed with said hole where said filling layer is formed.

15. A method of manufacturing a multilayered wiring structure, comprising:

forming a conductor film made of a metal on an insulating film;

forming a hole in said insulating film to expose said conductor film;

forming a filling layer made of a first metal and a second metal covering said first metal to fill said hole;

adhering said insulating film with said conductor film formed thereon to said substrate, said conductor film being located over the insulating film, such that said filling layer comes into contact with a predetermined portion of said metal substrate, said conductor film forming a wiring layer on an insulating layer comprising said insulating film; and compression-bonding said filling layer and said substrate by heating a contact portion therebetween to a predetermined temperature, thereby forming an alloy of said second metal and a metal forming said substrate at a contact region between said filling layer and said substrate.

16. A method according to claim 15, wherein said adhering and said compression-bonding are performed simultaneously.

17. A method according to claim 15, wherein said substrate is made of copper, and said second metal is gold.

18. A method according to claim 15, wherein said filling layer is formed to project from a surface of an insulating layer formed with said hole where said filling layer is formed.

19. A method of manufacturing a multilayered wiring structure comprising:

forming a first insulating layer on a substrate;

forming a first wiring layer on said first insulating layer;

forming a second insulating layer on said first wiring layer;

forming a conductor film made of a metal on said second insulating layer;

forming a hole extending from said conductor film to said insulating film to expose a surface of said first wiring layer;

forming a filling layer made of a first metal and a second metal covering said first metal to fill said hole from an exposed surface of said first wiring layer;

patterning said conductor film to form a second wiring layer; and compression-bonding said filling layer and said second wiring layer by heating a filling layer and said second wiring layer by heating a contact portion there between to a predetermined temperature to form an alloy of said second metal and a metal forming said second wiring layer at a contact region between said filling layer and said second wiring layer.

20. A method according to claim 19, wherein said second wiring layer is made of copper, and said second metal is gold.

21. A method of manufacturing a multilayered wiring structure, comprising:

forming an insulating layer on a substrate;

forming a conductor film on said insulating layer;

forming a hole extending from said conductor film to said insulating film to expose a surface of said substrate;

forming a filling layer made of a first metal and a second metal covering said first metal to fill said hole from an exposed surface of said substrate;

patterning said conductor film to form a wiring layer; and compression-bonding said filling layer and said wiring layer by heating a contact portion therebetween to a predetermined temperature, to form an alloy of said second metal and a metal forming said wiring layer at a contact region between said filling layer and said wiring layer.

22. A method according to claim 21, wherein said substrate is made of copper, and said second metal is gold.

* * * * *

UNITED STATES PATENT AND TRADEMARK OFFICE
CERTIFICATE OF CORRECTION

PATENT NO.    : 6,274,404 B1
DATED         : August 14, 2001
INVENTOR(S)   : Hirasawa et al.

It is certified that error appears in the above-identified patent and that said Letters Patent is hereby corrected as shown below:

<u>Title page,</u>
Item [73], please change the Assignees to: -- NEC Corporation, of Tokyo (JP); Fuchigami Micro Co., Ltd., of Kagoshima (JP) --

Signed and Sealed this

Fifteenth Day of April, 2003

JAMES E. ROGAN
*Director of the United States Patent and Trademark Office*